Figure 1:
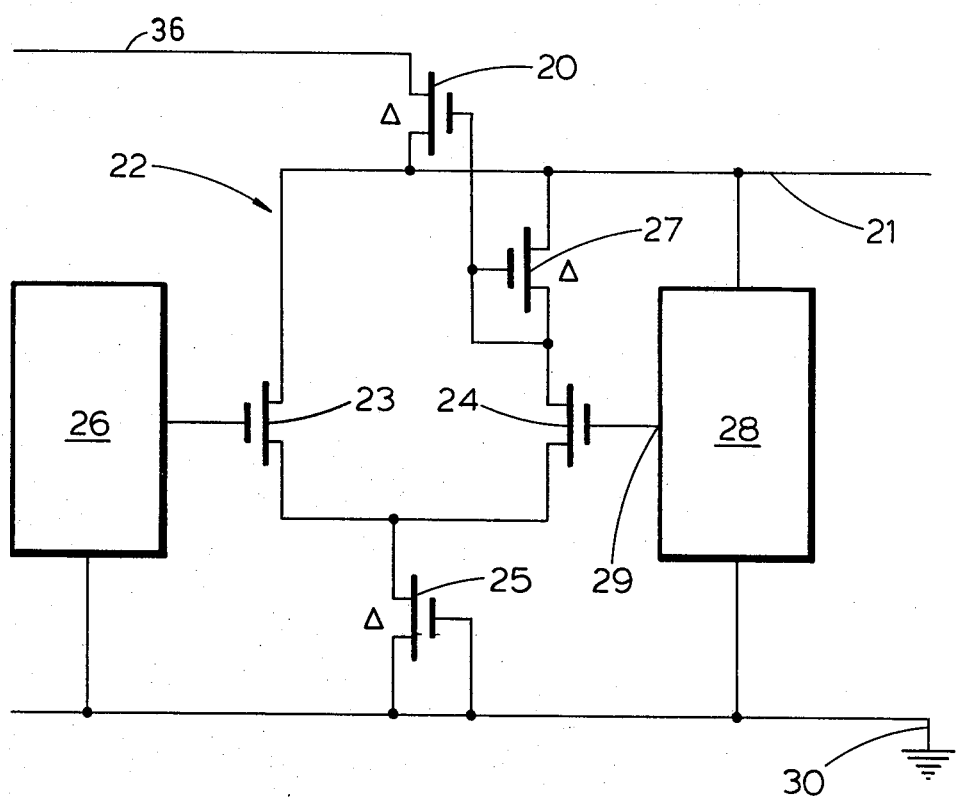

United States Patent [19]

Hilbourne

[11] 4,318,040
[45] Mar. 2, 1982

[54] POWER SUPPLY CIRCUIT

[75] Inventor: Robert A. Hilbourne, Eastleigh, England

[73] Assignee: U.S. Philips Corporation, New York, N.Y.

[21] Appl. No.: 90,969

[22] Filed: Nov. 5, 1979

[30] Foreign Application Priority Data

Nov. 14, 1978 [GB] United Kingdom ............... 44330/78

[51] Int. Cl.³ .............................................. G05F 3/02
[52] U.S. Cl. ..................................... 323/312; 307/304
[58] Field of Search ..................... 307/297, 304; 323/1, 323/4, 19, 22 R, 311, 312, 313; 330/296, 297

[56] References Cited

U.S. PATENT DOCUMENTS

| | | | |
|---|---|---|---|
| 3,757,200 | 9/1973 | Cohen | 323/33 R X |
| 3,975,649 | 8/1976 | Kawagoe et al. | 307/304 |
| 4,020,367 | 4/1977 | Yamashiro et al. | 323/22 R X |
| 4,093,909 | 6/1978 | Watrous et al. | 323/22 R |
| 4,096,430 | 6/1978 | Waldron | 307/304 X |
| 4,128,816 | 12/1978 | Shimotsuma | 323/19 X |
| 4,152,716 | 5/1979 | Torii et al. | 323/22 R X |
| 4,158,804 | 6/1979 | Butler et al. | 307/304 X |
| 4,165,478 | 8/1979 | Butler et al. | 323/22 R X |

Primary Examiner—William M. Shoop
Attorney, Agent, or Firm—James J. Cannon, Jr.

[57] ABSTRACT

A power supply circuit for supplying current to a MOS depletion load transistor logic circuit for use in programmers for washing machines or controllers for tumble driers. The power supply circuit comprises a depletion MOS transistor having its drain-source path connected between first and second power supply rails. The conductivity of the depletion transistor is controlled by a long tail pair amplifier which compares a reference voltage derived from a source with a voltage derived from the second supply rail using a voltage divider. The voltage divider is constructed to compensate for the effects of process variations on parameters such as threshold voltage and thereby hold the voltage divider ratio substantially constant. The voltage divider comprises two enhancement MOS transistors connected in series between the second supply rail and ground and a current source in the form of a depletion MOS transistor and an enhancement transistor connected in series between the first and second supply rails. The gates of all the transistors are connected to a junction of the current source transistor and the drain of the transistor connected thereto. The voltage across the drain-source of this latter transistor varies with threshold voltage and is added to the voltage on the second rail. Further the voltage at the gates of the enhancement transistors of the voltage divider is used to vary their conductivity.

12 Claims, 8 Drawing Figures

POWER SUPPLY CIRCUIT

The present invention relates to a power supply circuit which uses MOS transistors and particularly but not exclusively to an on-chip power supply constructed as an integrated circuit using n-channel MOS transistors.

Large scale integrated (LSI) circuits manufactured using n-channel MOS transistors are finding practical application as low cost circuitry in logic control applications such as a programmer for a domestic automatic washing machine and a controller for a domestic tumble drier. Depletion load logic circuits have their best performance at a supply voltage of substantially 5 V but it may be necessary to operate peripheral parts of the LSI circuit at say 12 V in order to give the required output signals. While it would be possible to supply the different voltages externally of the LSI circuit, this entails using external connections which cannot always readily be made available because of the other requirements of the LSI circuit.

Accordingly it is desirable to produce the internal power supplies on the LSI circuit chip. One way of doing this would be for example to supply 12 V to the chip and then connect a transistor in series with the supply and vary the voltage on its gate to give the desired voltage, for example, 5 V, at its source. Such an internal power supply is shown in FIG. 1 of the accompanying drawings which is a part schematic and a part block schematic circuit diagram of a power supply having a depletion MOS transistor as the series transistor.

A 12 V input supply is connected to the drain of a depletion MOS transistor 20, the source of which is connected to a nominally 5 V regulated voltage rail 21. The conductivity of the transistor 20 is varied in response to the variations in the voltage on rail 21 by means of a long tail pair amplifier circuit 22. The circuit 22 comprises enhancement MOS transistors 23, 24, the sources of which are connected together and the junction thereof is connected to ground 30 via a depletion MOS transistor 25 which provides a substantially constant current to the amplifier circuit. The drain of the transistor 23 is connected to the rail 21 while its gate is connected to a reference voltage source 26. A depletion MOS transistor 27 is connected between the drain of the transistor 24 and the rail 21. The drain of the transistor 24 is also connected to the gates of the transistors 20, 27. With such an arrangement the transistor 27 acts as a voltage dropping resistance which enables the gate of the series transistor 20 to be controlled. A voltage divider 28 is connected between the rail 21 and ground and a tap 29 of the divider 28 is connected to the gate of the transistor 24.

As the operation of a long tail pair amplifier in controlling the series element of a power supply is well known it will not be restated. However it is pointed out that the use of a depletion transistor as the series element enables its gate voltage to be more negative than the regulated voltage on the rail 21 and hence the amplifier 22 can be operated from the regulated supply. This gives good isolation between the supply voltage and the regulated voltage.

With the described circuit the regulated or stabilized voltage on the rail 21 is substantially equal to the ratio of the reference voltage and the voltage divider ratio.

In the case of fabricating the power supply as an integrated circuit the voltage divider would not comprise resistors but instead would comprise MOS transistors. However a problem which arises is that due to process variations which arise in the manufacture of LSI circuits, various parameters of the MOS transistors may vary, one of these parameters being the threshold voltage. In view of the fact that the regulated voltage on the rail 21 is inversely proportional to the potential divider ratio which may be affected by the variation in threshold voltage of the transistors forming the voltage divider, it is desirable to make at least the potential divider of the power supply circuit substantially independent of the effects of process variations on the threshold voltage of the transistors.

According to the present invention there is provided a power supply circuit comprising a first, input supply rail, a second, output power supply rail, a depletion MOS transistor having its source-drain path connected between the first power supply rail and the second power supply rail, a long tail pair amplifier for comparing a signal indicative of the voltage on the second power supply rail with a reference voltage signal, the amplifier comprising first and second enhancement MOS transistors, the drain of the first transistor being coupled to the second power supply rail, the drain of the second transistor being coupled to the second power supply rail by way of a voltage dropping MOS transistor and to the gate of the depletion transistor, and a voltage divider having a tap connected to the gate of the first or second transistor, wherein the voltage divider comprises third, fourth and fifth enhancement MOS transistors having their drain-source paths connected in series and a current source coupled to the drain of the third transistor, which drain is connected to the gates of the third, fourth and fifth transistors, the junction of the source of the third transistor and the drain of the fourth transistor being coupled to a regulated power supply and said tap being formed by the junction of the source of the fourth transistor and drain of the fifth transistor whose source is coupled to a third supply rail, whereby in use the voltage divider ratio is held substantially constant due to the third transistor compensating for the effects of process variations on threshold voltage.

In a power supply circuit in accordance with the present invention the current source connected to the drain of the third transistor may comprise a further depletion MOS transistor with its gate connected to the third, fourth and fifth transistors or two further depletion MOS transistors having their source-drain paths connected in series between the first power supply rail and the drain of the third transistor and their gates connected to the gates of the third, fourth and fifth transistors.

The regulated power supply may comprise the second power supply line or the tap of a voltage step-down arrangement comprising a fourth depletion MOS transistor and a zener diode connected between the first and third supply rails. The tap of the voltage divider may be connected to the gate of the second transistor.

One present problem with on-chip power supplies is the provision of a satisfactory reference voltage source. If it is desired to compensate for threshold voltage variations with process variations, one reference voltage source may comprise a voltage step-down arrangement comprising a depletion transistor and an externally connected zener diode coupled in series between the first and third power supply rails, the junction of the depletion transistor and zener diode is connected to another voltage divider including a current source connected to the series connected source-drain paths of sixth, seventh and eighth enhancement MOS transistors, the gates of which are connected to the drain of the sixth transistor, the drain of the seventh transistor being connected to said junction and the drain of the eighth transistor being connected to the gate of the first transistor to provide the reference voltage signal.

Alternatively in the case of logic circuits in which changes in circuit performance due to the variations in threshold voltage could be compensated by a corresponding change in the regulated voltage on the second power supply rail, the power supply circuit may be adapted to produce such a corresponding change.

In an embodiment of one such power supply the voltage on the first power supply rail is not stabilized and a voltage step-down arrangement comprising a depletion transistor and an external zener diode is connected between the first and third supply rails. The junction of the source of the third transistor and the drain of the fourth transistor of the voltage divider is connected to the junction of the depletion transistor and zener diode and the tap is connected to the gate of the second transistor. Also connected between said junction and the third supply rail is an inverting amplifier network comprising two enhancement MOS transistors connected in series. The gate of the enhancement transistor whose drain is connected to the zener diode is connected to the current source of the voltage divider and the gate of the other of the enhancemwent transistors whose drain is connected to the gate of first transistor of the long tail pair amplifier is connected to the second power supply rail. In consequence one of these enhancement transistors provides a current source for the amplifying other one of these enhancement transistors. In this embodiment the output to the series depletion transistor is taken from the drain circuit of the second transistor of the long tail pair amplifier because increases in the level of the second supply rail are inverted by the other one of the two enhancement transistors and results in a decrease in the voltage at the gate of the first transistor of the long tail pair amplifier. In order that the other one of the two enhancement transistors will maintain the voltage at the gate of the first transistor of the long tail pair amplifier constant, the effective drive voltage must remain constant. Therefore if the threshold voltage of the amplifying other one of the two enhancement transistors goes high there must be a corresponding increase in the voltage of the second supply rail and vice versa. By suitably selecting the W/L ratios of the current source and amplifying transistors a substantially linear relationship can be obtained between the variation in the regulated output voltage on the second supply rail with threshold voltage variation.

In the previously described power supply circuit, the first supply rail which may be at a nominal 12 volts is stabilized within the required tolerance limits of ±10% by using an external zener diode, the voltage on the first rail being divided down to provide an internal reference voltage signal. When the first supply rail is at a higher voltage of say 15 to 18 volts, it is possible to use one of the compensated voltage dividers to provide a reference voltage signal within the required tolerance limits.

Alternatively if the first supply rail is stabilized within the required tolerance limits then a simple transistor divider can be used to derive the reference voltage signal which is threshold voltage dependent and consequently the voltage on the second supply rail is also threshold voltage dependent. In one such embodiment the first power supply rail is stabilised within say ±10% of its nominal voltage and the reference voltage source is a simple divider in the form of two enhancement MOS transistors connected in series between the first and third supply rails. The gate of each transistor is connected to its drain and the reference voltage signal is tapped off from the junction of the drain of one transistor and the source of the other transistor. With this embodiment the reference voltage is slightly above a threshold voltage relative to the third supply rail and any variation in the threshold voltage will produce a corresponding change in the reference voltage and subsequently in the regulated voltage on the second power supply rail. By suitably selecting the width to length (W/L) ratios of the enhancement transistors a generally linear relationship can be established between the variation in the regulated voltage and that of the threshold voltage.

If desired the reference voltage source may be completely on-chip and derive its supply from the second and third supply rails. One such source may comprise a depletion MOS transistor connected in series with the source-drain paths of two series connected enhancement MOS transistors and another of such sources may comprise two series connected depletion MOS transistors. In both these cases the reference voltage is very dependent on process parameters.

Figure 2:
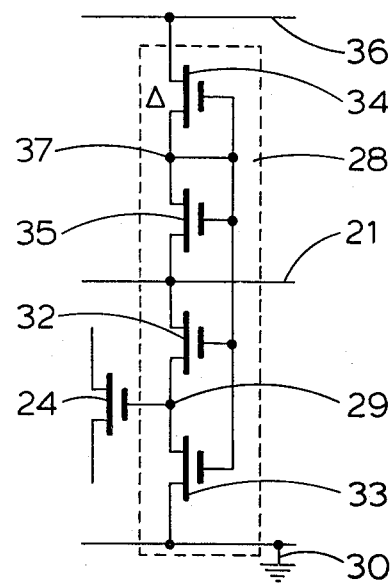
Figure 3:
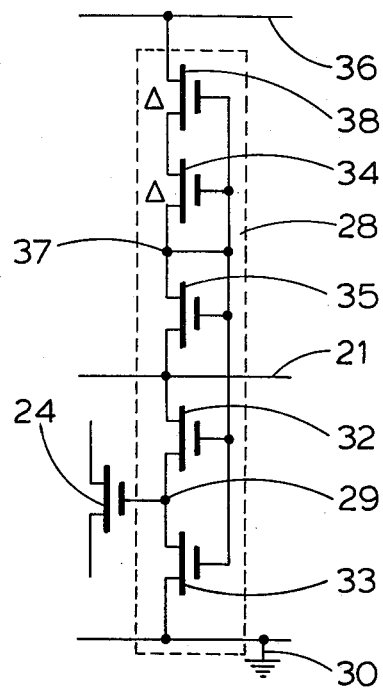
Figure 4:
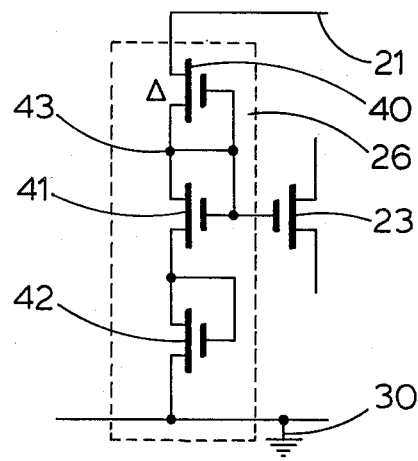
Figure 5:
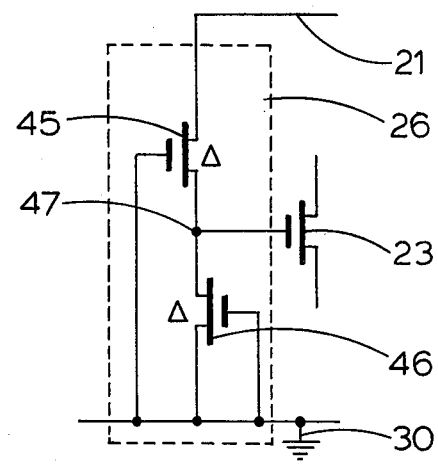
Figure 6:
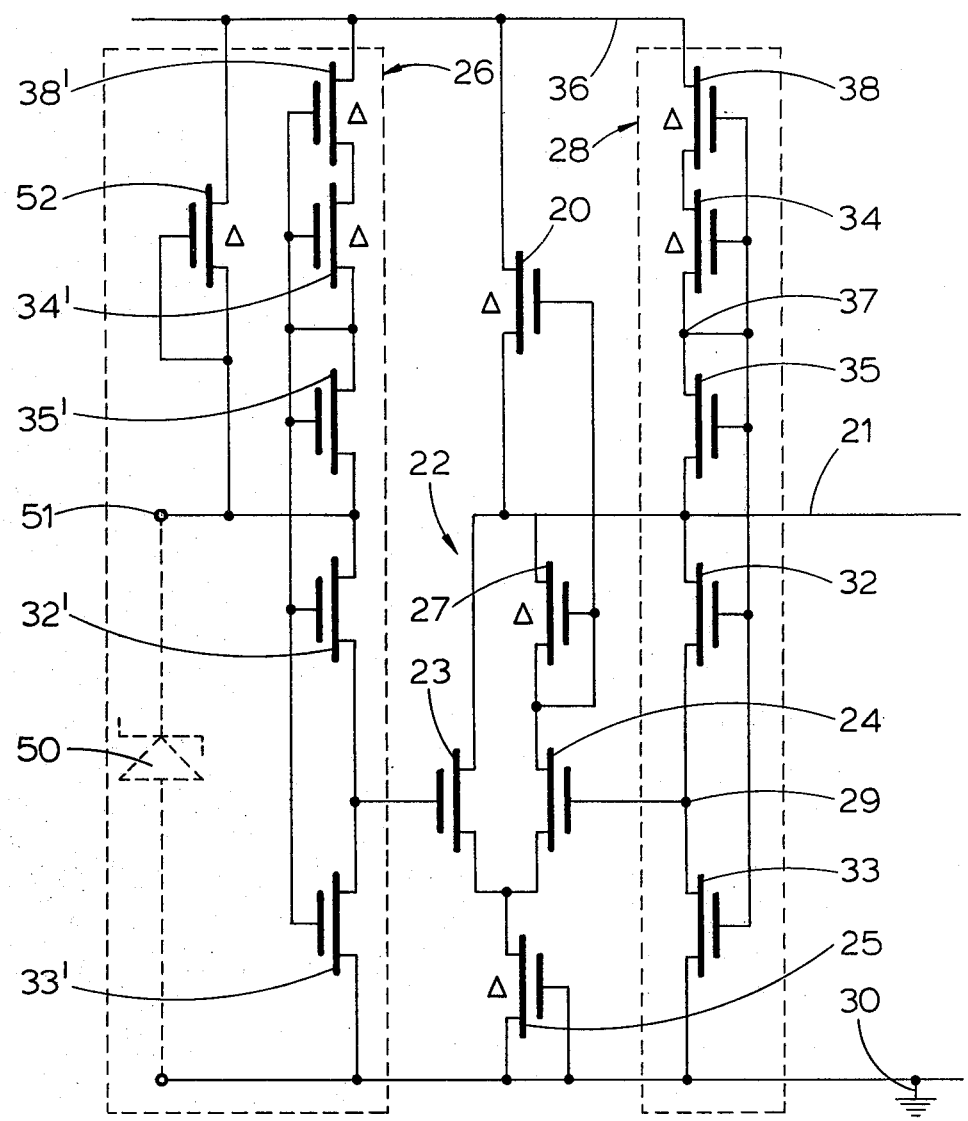
Figure 7:
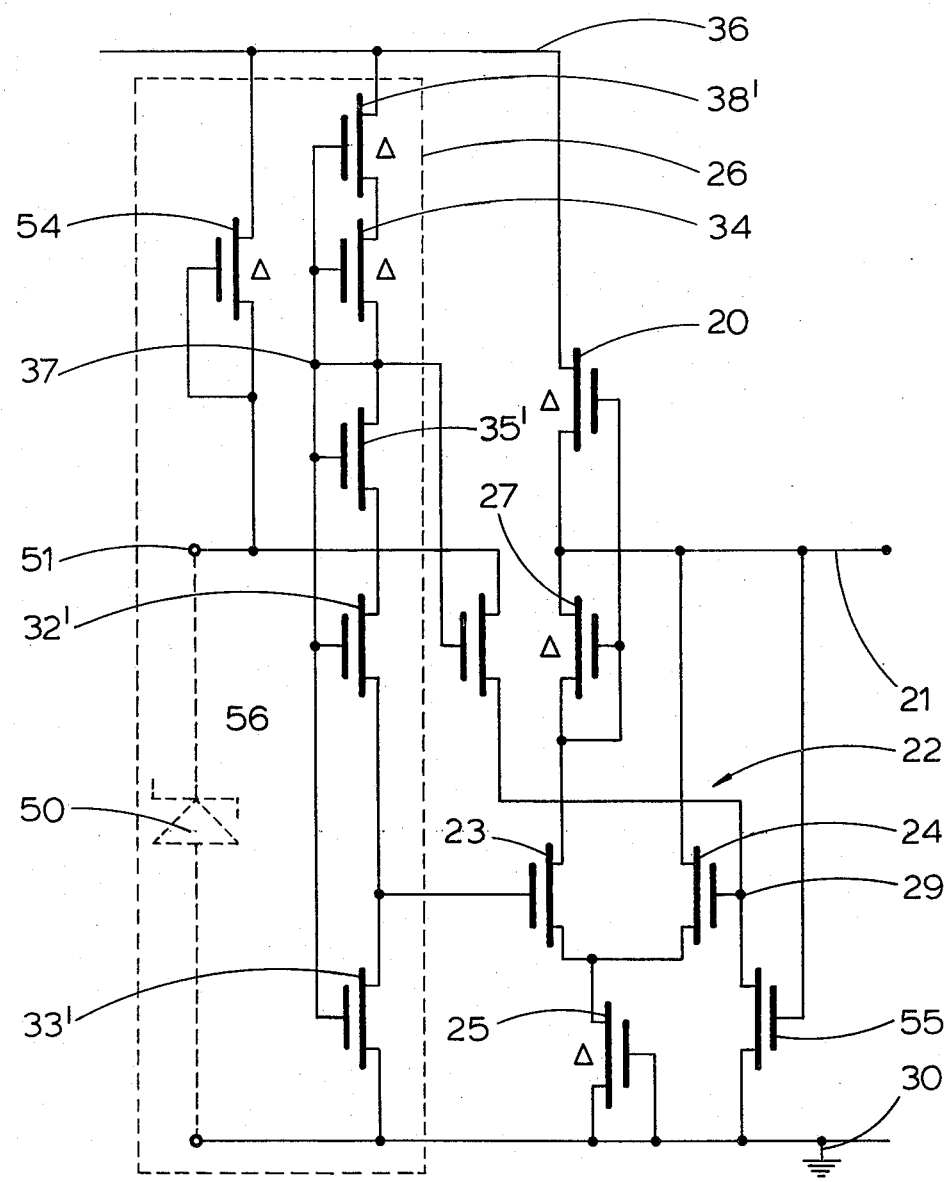
Figure 8:
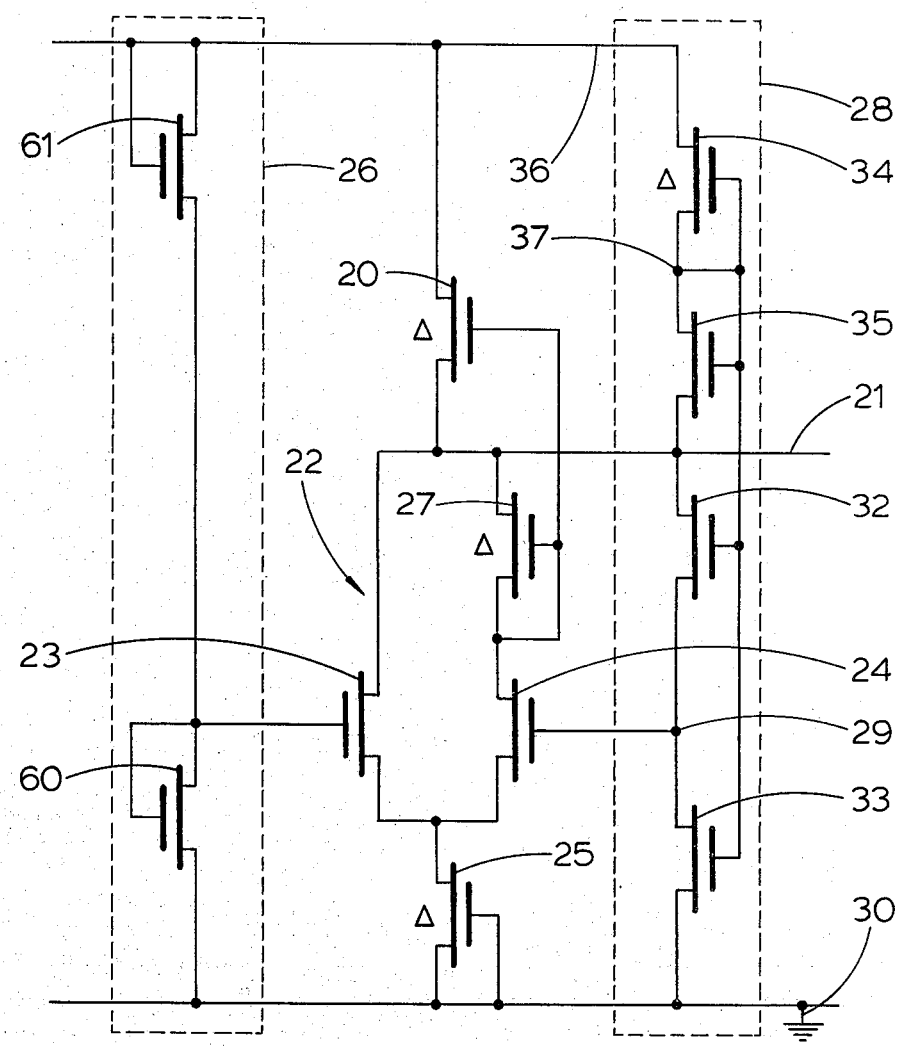

The present invention will now be described, by way of example, with reference to FIGS. 2 to 8 of the accompanying drawings, wherein:

FIG. 2 is a schematic circuit diagram of a voltage divider which is substantially independent of the effects of process variations on threshold voltage, FIG. 3 is a schematic circuit diagram of a development of the voltage divider shown in FIG. 2, FIG. 4 is a schematic circuit diagram of an embodiment of an on-chip reference voltage source using enhancement and depletion MOS transistors, FIG. 5 is a schematic circuit diagram of an embodiment of an on-chip reference voltage source using depletion MOS transistors, FIG. 6 is a schematic circuit diagram of an embodiment of a power supply circuit in accordance with the invention in which the voltage divider is of the type shown in FIG. 3 and the reference voltage is derived using an external zener diode and another voltage divider of the type shown in FIG. 3, FIG. 7 is a schematic circuit diagram of another embodiment of a power supply circuit in which the regulated voltage varies with threshold voltage, and FIG. 8 is a schematic circuit diagram of a further embodiment of the power supply circuit in accordance with the invention in which the supply voltage is externally stabilised and the voltage divider is of the type shown in FIG. 2.

In order to facilitate the understanding of the invention corresponding reference numerals have been used to indicate the same features in each of the Figures. The MOS transistors shown are all n-channel transistors but the illustrated circuits could be adapted for use with p-channel MOS transistors. Further it is to be assumed that the supply voltage is nominally 12 volts and the regulated voltage is 5 volts. However these two voltages may be different and the width/length (W/L) ratios of the transistors is determined accordingly.

The voltage divider 28 shown in FIG. 2 comprises two enhancement transistors 32, 33 with their source-drain paths connected in series between the regulated voltage rail 21 and ground 30. The tap 29 of the voltage divider 28 is constituted by the junction of the drain of transistor 33 and the source of the transistor 32. If the voltage divider comprised only these two transistors, the voltage divider ratio would be affected adversely by the effect of process variations on the threshold voltage. In order to overcome this problem, the voltage divider 28 also comprises a depletion transistor 34 and an enhancement transistor 35 with their source-drain paths connected in series between a rail 36 which is also connected to the drain of the series transistor 20, and the rail 21. The voltage on the rail 36 may be stabilised or unstabilized. A junction 37 of the drain of the transistor 35 and the source of the transistor 34 is connected to the gates of the transistors 32 to 35.

The transistor 34 which has a W/L ratio of 6/80 constitutes a current source whereas the transistor 35 which has a W/L ratio of 100/7 constitutes a low impedance between the junction 37 and the rail 21. The voltge across the source-drain of the transistor 35 varies with threshold voltage, $V_T$, and is added to the regulated voltage on the line 21. This additional voltge compensates for variations in the value of the threshold voltage of the transistors 32, 33. As the drive voltage for the gates of the transistors 32, 33 is derived from the junction 37, then if the threshold voltage of the transistors 32, 33 and 35 is high due to process variations, the transistors 32, 33 are driven harder but the effective gate drive voltage remains constant because $V_T$ of the driven transistor has also increased and thereby the voltage divider ratio at the tap 29 is held substantially constant. Alternatively if the threshold voltage of the transistors of the LSI circuit is low due to process variations then the transistors will not be driven so hard and the threshold voltage added to the rail 21 will be lower so again the effective drive remains constant and the combined effect is to hold the voltage divider ratio at the tap 29 substantially constant.

The voltage divider 28 shown in FIG. 3 differs from that shown in FIG. 2 by the addition of a second depletion transistor 38 having its source connected to the drain of the transistor 34, its drain connected to the rail 36 and its gate to the gates of the other transistors 32 to 35 of the voltage divider. The function of the transistor 38 which has a W/L ratio of 12/10 is to reduce the effect of any variations in the supply voltage on the rail 36, which variations may affect adversely the conduction of the transistor 35 and thereby the drive voltage derived from the junction 37. The voltage divider of FIG. 3, like that of FIG. 2 is substantially unaffected by the variations in threshold voltage.

In the case of an on-chip reference voltage source, it has been found difficult to make a completely satisfctory one. However a number of reference voltage sources will be described which are suitable for use in the power supply circuit in accordance with the invention.

The reference voltage source 26 shown in FIG. 4 is an on-chip source which is connected between the regulated voltage rail 21 and ground 30. The reference voltage source 26 comprises a depletion transistor 40 having its drain connected to the rail 21 and its source to the drain of an enhancement transistor 41 whose source is connected in series with the drain-source path of another enhancement transistor 42. A junction 43 of the drain of the transistor 41 and the source of the transistor 40 is connected to the gates of the transistors 40, 41. The gate of the transistor 42 is connected to its drain. The transistor 40 has a W/L ratio of 6/60 and serves as a current source for the transistors 41, 42 each of which has a W/L ratio of 100/6. The reference voltage applied to the gate of the transistor 23 is effectively the sum of the threshold voltages of the transistors 41, 42 ($2V_T$) plus $K\int V_T$ where K is a parameter related to the amount by which the threshold voltge of a MOS transistor changes with the source to substrate voltage. Hence the circuit is not independent of the effect of process variations on the parameters of the transistors.

FIG. 5 shows a reference voltage source 26 comprising two depletion transistors 45, 46 with the source-drain paths connected in series between the regulated voltage rail 21 and ground 30. A junction 47 of the source of the transistor 45 and the drain of the transistor 46 is connected to the gate of the transistor 23. The gates of both the transistors 45, 46 are connected to ground. The W/L ratio of the transistor 46 is 8/60 and consequently has a low gain and passes a small current through the transistor 45 which because it has a W/L ratio 100/60 has a high gain so that the junction 47 is biassed to slightly less than the threshold voltage. As with the circuit of FIG. 4, this circuit is not completely independent of the effects of process variations on the threshold voltage.

FIG. 6 shows a power supply circuit in which the voltage divider 28 is of the type shown in FIG. 3 and accordingly will not be described again.

The reference voltage source 26 is partly on-chip and partly off-chip insofar that a zener diode 50 is provided externally of the LSI circuit and is connected between an input terminal 51 and ground. A depletion transistor 52 is connected between the supply rail 36 and the terminal 51. Another voltage divider of the type shown in FIG. 3 is connected between the rail 36 and ground 30 and for convenience the corresponding transistors are referenced with primed numerals. The junction of the drain of the enhancement transistor 32' and the source of the enhancement transistor 35' is connected to the terminal 51 while the junction of the source of the enhancement transistor 32' and the drain of the enhancement transistor 33' is connected to the gate of the transistor 23.

In the embodiment of FIG. 6 the transistor 52 provides the bias current to the zener diode 50 and the zener voltage of say 5.6 volts is stepped down by the divider circuit to give a reference voltage which is at a convenient level to drive the amplifier transistor 23. The exact reference voltage is determined by the width to length ratios of the transistors in the voltage divider of the reference voltage source 26.

From calculations done, the circuit of FIG. 6 is able to produce a fairly accurately regulated voltage on the rail 21. For example if the supply voltage of the rail 36 is varied from 9 to 15 volts, the regulated voltage is changed by 40 mV and a variation in the threshold voltage from 0.6 to 1.2 volts changes the voltage on the rail by 60 mV. Hence the circuit is substantially independent of the effects of process variations.

In the case of the illustrated circuit the output resistance is of the order of 45 ohms over an operating current range of 0 to 5 mA. The output resistance can be reduced by increasing the gain of the transistors 23, 24 and/or of the series transistor 20 since this increases the loop gain. Increasing the gain of the transistor 20 also increases the operating current range. Varying the gain of the transistors 23, 24 also alters the recovery time of the circuit to load transients and generally the higher the gain the shorter the recovery time.

FIG. 7 shows another embodiment of a power supply circuit. In this embodiment the regulated voltage on the rail 21 has been made threshold voltage dependent. Such a change in the regulated voltage may be used to compensate for the change in performance of a logic circuit due to corresponding variations in the threshold voltage.

FIG. 7 differs from FIG. 6 and the yet to be described FIG. 8 in a number of respects. The transistor 27 is connected between the drain of the transistor 23 and the rail 21 and the drain of the transistor 24 is connected directly to the rail 21. The reference voltage source 26 which includes a voltage divider of the type shown in FIG. 3, is the same as that shown in FIG. 6 and accordingly will not be described again. An inverting amplifier network is coupled between the terminal 51 and ground 30. The inverting amplifier comprises enhancement MOS transistors 55, 56 having their source-drain paths connected in series between the terminal 51 and ground 30. The tap 29 is connected to the junction of the drain of transistors 55 and the source of the transistor 56, the gate of the transistor 55 is connected to the rail 21 while the gate of the transistor 56 is connected to the junction 37.

In operation of the circuit of FIG. 7 the reference voltage at the gate of the transistor 23 is maintained substantially constant. The gate of the transistor 56 receives a substantially constant drive from the junction 37 and its drain is held at a constant voltage. Thus the transistor 56 constitutes a current source. The substantially fixed current from the transistor 56 is sunk by the transistor 55 which also provides a phase inversion between the rail 21 and the tap 29, that is the gate of transistor 24.

In order to have a defined voltage at the tap 29, the effective drive voltage on the gate 55 must be constant. Therefore if the threshold voltage $V_T$ of the transistor 55 is higher due to process variations, the regulated voltage on the rail 21 must follow the variation in $V_T$. In one example if there is a change in the threshold voltage of the enhancement transistors from say 0.6 volts to 1.2 volts, an increase in the regulated voltage from 4.5 volts to 5.35 volts occurs as a result of the transistor 20 being driven harder.

However if the regulated voltage on the rail 21 goes high due to changes in load current, the voltage at the tap 29 goes low. As a result of negative feedback the voltage at the gate of the transistor 20 goes low thereby reducing the voltage on the rail 21.

FIG. 8 is a second embodiment of a threshold voltage dependent circuit. However unlike FIG. 7 the circuit is a completely on-chip and requires the supply rail 36 to be at a stabilised voltage of say 12 volts ±10%. The volage divider 28 is of the same type as in FIG. 2 and accordingly will not be described further.

The reference voltage source 26 comprises two enhancement transistors 60, 61 having their source-drain paths connected in series between ground 30 and the externally stabilised supply rail 36. The gate of each transistor is connected to its drain and in the case of the transistor 60, its drain is connected to the gate of the transistor 23.

Hence the reference voltage is made threshold voltage dependent. By suitably choosing the W/L ratios of the transistors 60, 61, the manner in which the regulated voltage tracks the threshold voltage can be adapted to suit the logic circuit (not shown). Another consideration in choosing the W/L ratios of the transistors 60, 61 is to provide the desired reference voltage which is at about half the nominal regulated voltage on the rail 21. With the circuit configuration of FIG. 8 it is necessary to stabilized the supply voltage on the rail 36 because a ±10% variation in the supply voltage results in a variation of ±7% in the regulated voltage.

In the circuits of FIGS. 6, 7 and 8 the voltage divider 28 may comprise one or other of the circuits shown in FIGS. 2 and 3.

I claim:

1. A power supply circuit comprising a first, input supply rail, a second, output power supply rail, a depletion MOS transistor having its source-drain path connected between the first power supply rail and the second power supply rail, a long tail pair amplifier for comparing a signal indicative of the voltage on the second power supply rail with a reference voltage signal, the amplifier comprising first and second enhancement MOS transistors, the drain of the first transistor being coupled to the second power supply rail, the drain of the second transistor being coupled to the second power supply rail by way of a voltage dropping MOS transistor and to the gate of the depletion transistor, and a voltage divider having a tap connected to the gate of the first or second transistor, wherein the voltage divider comprises third, fourth and fifth enhancement MOS transistors having their drain-source paths connected in series and a current source coupled to the drain of the third transistor, which drain is connected to the gates of the third, fourth and fifth transistors, the junction of the source of the third transistor and the drain of the fourth transistor being coupled to a regulated power supply and said tap being formed by the junction of the source of the fourth transistor and drain of the fifth transistor whose source is coupled to a third supply rail, whereby in use the voltage divider ratio is held substantially constant due to the third transistor compensating for the effects of process variations on threshold voltage.

2. A power supply circuit as claimed in claim 1, wherein the current source of the voltage divider comprises a further depletion MOS transistor having its drain connected to the first power supply rail, its source connected to the drain of the third transistor and its gate connected to the gates of third, fourth and fifth transistors.

3. A power supply circuit as claimed in claim 1, wherein the current source of the voltage divider comprises two further depletion MOS transistors having their source-drain paths connected in series between the first power supply rail and the drain of the third transistor and their gates connected to the gates of the third, fourth and fifth transistors.

4. A power supply as claimed in any one of claims 1 to 3, wherein the tap of the voltage divider is connected to the gate of the second transistor.

5. A power supply circuit as claimed in claim 4, wherein the junction of the source of the third transistor and the drain of the fourth transistor is coupled to the second power supply rail.

6. A power supply circuit as claimed in claim 4, further comprising a voltage step-down arrangement including a fourth depletion MOS transistor having its gate connected to its source and a zener diode connected in series between the first power supply rail and the third supply rail.

7. A power supply circuit as claimed in claim 6, wherein the junction of the source of the third transistor and the drain of the fourth transistor is coupled to the junction of the fourth depletion transistor and the zener diode.

8. A power supply circuit as claimed in claim 7, further comprising an inverting amplifier including two enhancement MOS transistors having their source-drain paths connected in series between the junction of the fourth depletion transistor and zener diode and the third supply rail, a junction of the drain of one of the two transistors and the source of the other of the two transistors is connected to the gate of the first transistor of the long tail pair amplifier, the gate of the one of the two transistors is connected to the second power supply rail and the gate of the one of the two transistors is connected to the gates of the third, fourth and fifth transistors.

9. A power supply circuit as claimed in claim 6, wherein the junction of the source of the third transistor and the drain of the fourth transistor is coupled to the second power supply rail, the voltage step-down arrangement comprises a part of a reference voltage source the other part of which comprises another voltage divider including a current source connected to the series connected source-drain paths of sixth, seventh and eighth enhancement MOS transistors, the gates of which are connected to the drain of the sixth transistor, the drain of the seventh transistor being connected to the junction of the zener diode and the depletion transistor and the drain of the eighth transistor being connected to the gate of the first transistor in order to derive the reference voltage signal.

10. A power supply circuit as claimed in claim 5, wherein the first supply rail is a stabilized voltage rail and a reference voltage source is provided and comprises two enhancement MOS transistors with the source-drain paths connected in series between the first power supply rail and the third supply rail, the gate of each transistor being connected to its drain and a junction between the two transistors being connected to the gate of the first transistor.

11. A power supply circuit as claimed in claim 5, further comprising a reference voltage source including a depletion MOS transistor having its drain connected to the second power supply rail and its source connected to drain of a sixth enhancement transistor whose source is connected to the drain of a seventh enhancement transistor whose source is connected to the third supply rail, the gates of the depletion and sixth transistors being connected to the gate of the first transistor to provide the reference voltage signal and to the source of the depletion transistor, and the gate of the seventh transistor being connected to its drain.

12. A power supply circuit as claimed in claim 5, further comprising a reference voltage source including two depletion MOS transistors with their source-drain paths connected in series between the first and the third supply rails, the gates of both said transistors being connected to the third supply rail and a junction of the drain of one transistor and the source of the other transistor being connected to the gate of the first transistor to provide the reference voltage signal.

* * * * *